(12) United States Patent
Chun

(10) Patent No.: US 6,486,058 B1
(45) Date of Patent: Nov. 26, 2002

(54) METHOD OF FORMING A PHOTORESIST PATTERN USING WASOOM

(75) Inventor: Jun-Sung Chun, Portland, OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/679,265

(22) Filed: Oct. 4, 2000

(51) Int. Cl.$^7$ .............................................. H01L 21/76
(52) U.S. Cl. ...................... 438/637; 438/694; 438/672; 438/681
(58) Field of Search ................................ 438/637, 652, 438/672, 680, 681, 688, 738, 736, 725, 945, 970

(56) References Cited

U.S. PATENT DOCUMENTS

| | | | |
|---|---|---|---|
| 4,022,932 A | 5/1977 | Feng ............................ | 427/93 |
| 4,889,795 A | 12/1989 | Kaifu et al. ................. | 430/326 |
| 5,024,919 A | 6/1991 | Yamauchi et al. ........... | 430/312 |
| 5,174,858 A | 12/1992 | Yamamoto et al. ......... | 156/643 |
| 5,770,520 A | 6/1998 | Zhao et al. .................. | 438/653 |
| 5,990,003 A | * 11/1999 | Oda ............................ | 438/637 |

OTHER PUBLICATIONS

Kanda et al., "Advanced Microlithography Process with Chemical Shrink Technology", Advances in Resist Technology and Processing XVII, pp. 881–889 Francis M. Houlihan, Editor, Proceeding of SPIE vol. 3999 (2000).*

Yamaguchi, T., Matsui T., Kanamoro, J, Miyakawa Y. and Shimoyama K. "0.2μm Hole Pattern Generation by Critical Dimension Biassing Using Resin Overcoat," Jpn. J. Appl. Phys., vol. 34 (1995) pp. 6615–6621, Partt 1, No. 12B, Dec. 1995.

Kanda T., Tanaka H., Yager K., Watse, N. "100 nm contact holes using resolution enhancement lithography assisted by chemical shrink," Microlithography World, pp. 26–27, Autumn 1999.

Kanada, T., Tanaka, H., Kinoshita Y., Watase, N., Eakin, R., Ishibashi, T., Toyoshima, T., Yasuda, N., Tanaka, M., "Advanced Microlithography Process with Chemical Shrink Technology," Advances in Resist Technology and Processing XVII, pp 881–889 Francis M. Houlihan, Editor, Proceedings of SPIE vol. 3999 (2000).

* cited by examiner

Primary Examiner—Keith Christianson
Assistant Examiner—Yennhu B. Huynh
(74) Attorney, Agent, or Firm—Marger, Johnson & McCollom, P.C.

(57) ABSTRACT

The method of forming a photoresist pattern defining a contact hole. A photoresist pattern that defines an opening therethrough is provided over a semiconductor substrate surface. Then, a layer of water-soluble organic over-coating material (WASOOM) is coated over the photoresist pattern including the opening thereof. Next, the resulting structure is flowed to shrink the size of the opening. After the resist reflow, WASOOM is removed. Thus, using the methods of the present invention, a photoresist pattern capable of forming a 0.18 μm (and below) contact hole can be formed using an inexpensive conventional optical lithography system. Further, because WASOOM is water-soluble, WASOOM can be substantially completely removed from the photoresist pattern using a simple cleaning process, i.e., water rinse, after baking for resist reflow. Thus, the process steps are simplified and the problems such as the difficulty in CD control and the environmental issues are avoided.

20 Claims, 2 Drawing Sheets

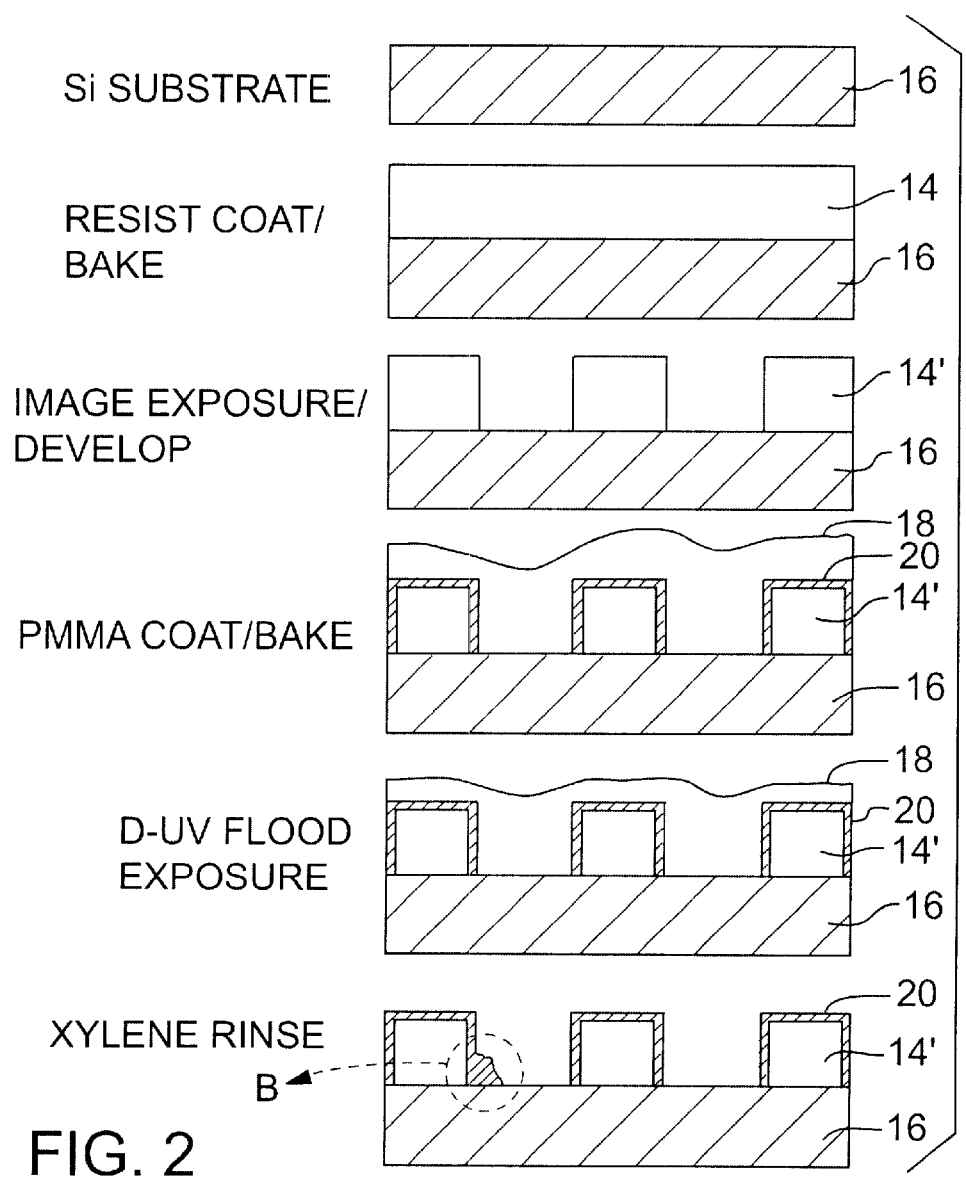

METHOD OF FORMING A PHOTORESIST PATTERN USING WASOOM

BACKGROUND OF THE INVENTION

1. The Field of the Invention

This invention relates to fabrication of semiconductor devices and, more particularly, to a method of forming a photoresist pattern using a resist reflow technique.

2. Description of the Related Art

Due to ever-increasing density in ULSI (ultra-large-scale integration) circuits, various techniques have been proposed to overcome the limits of the present semiconductor fabrication technology. For example, reduction in size of a contact hole has been actively pursued below the resolution limits of the current optical lithography technology.

To form a contact hole, optical lithography technology has been conventionally used to form a photoresist pattern 100. Using the photolithography technique, patterns of a mask are transferred onto a photoresist applied on a semiconductor substrate 102 including an insulating layer. The photoresist is subjected to development after patterns are transferred thereto. Thereafter, the underlying insulating layer is etched using the developed photoresist pattern.

In recent years, however, the minimum feature size of the advanced ULSIs has reached the resolution limits of the conventional optical lithography technology. For example, it is known that i-line lithography technology is adequate for forming a contact hole having a minimum feature size of over 0.30–0.35 μm. Thus, with current i-line or Krf optical lithography systems, the minimum feature size below sub-0.18 μm would be very difficult to achieve.

There have been attempts to solve the resolution problem. Particularly, the extension of the optical lithography technology for sub-0.18 μm contact hole lithography has been attempted. These attempts include: 1) Phase shift mask (PSM) technology, 2) Off-Axis illumination (OAI) technology, 3) resist reflow technology and 4) a multi-layer resist process.

Among these technologies, the resist reflow technology is potentially an excellent candidate because of its simplicity. One such resist reflow technology is disclosed in U.S. Pat. No. 4,022,932. In this technology, upon exposure to a vapor of a solvent, the photoresist flows apertures in the photoresist layer as a result of the increase in the volume of the photoresist and the decrease of the viscosity of the photoresist. As a result, the area of the apertures can be reduced. However, critical dimension (CD) control is very difficult in this technology because severe overhang often results in the photoresist contact hole pattern, as illustrated in FIG. 1. Worst case, the photoresist contact hole pattern could collapse at high temperatures. Another resist reflow technology is described in an article by Takahiro Yamauchi et al, entitled "0.2 μm Hole Pattern Generation by Critical Dimension Biasing Using Resin Overcoat," Jpn. J. Appl. Phys. Vol. 35 (1995) pp. 6615–6626, Part 1. No. 12B, December 1995. That method, illustrated here in FIG. 2, uses i-line resist and polymethyl methacrylate (PMMA). First, a novolak-based photoresist hole pattern 14' is formed on a semiconductor substrate 16, using resist coat/bake, and image expose/develop as illustrated. Then, PMMA 18 is coated over the photoresist hole pattern 14' by spin coating. Next, the resulting structure is baked to form an interfacial layer 20 between PMMA 18 and the hole pattern 14'. The interfacial layer is formed of a mixture of PMMA and the novolak resin. This interfacial layer defines the critical features. Subsequently, as shown in FIG. 2, using deep-UV flood exposure and xylene rinse, pure PMMA is stripped. The interfacial layer 20 remains on the side walls of the photoresist hole pattern 14', thereby shrinking the diameter of the photoresist hole pattern 14'. The interfacial layer 20 consequently functions as an etching mask to form a contact hole during a contact hole etching process.

Unfortunately, in this method, the cleaning steps for removing PMMA by deep-UV flood exposure and xylene rinse have made the overall process very complicated. In addition, by-product particles indicated by B undesirably left on the interfacial layer after the cleaning steps, and the difficulty of controlling the formation of the interfacial layer itself render the control of critical dimension (CD) very difficult. Further, because xylene is highly toxic, the use of xylene can cause various environmental problems. For these reasons, the method described in FIG. 2 has not been practically implemented.

More recently, Mitsubishi and Clariant developed contact hole shrinking methods, called RELACS (Resolution Enhancement Lithography Assisted by Chemical Shrink), which is described in an article by Takashi Kanda et al, entitled "100 nm Contact Holes Using Resolution Enhancement Lithography Assisted by Chemical Shrink," Microlithography World, Autumn 1999. This method uses organic chemical material that thermally cross-links with protons remaining on the walls of the patterned photoresist. This cross-linked area defines the critical features. However, many additional baking steps and photoresist development steps are also required in this method. Further, because the degree of cross-linking is not easily controlled, there have been problems in CD control. Also, undesirable reactants are left on the side walls of the photoresist pattern, which adversely affects controlling CD. For these reasons, practical implementation of the above-described resist flow technologies has not yet been very successful.

Accordingly, a need exists for a simplified and more practical method of forming a photoresist pattern for highly integrated ULSI circuits under the 0.18 μm design rule (and below) using the resist reflow technique. Particularly, a need exists for a method allowing precise CD control using conventional optical lithography equipment such as an inexpensive i-line lithography system.

SUMMARY OF THE INVENTION

The present invention relates to a method of forming a photoresist contact hole pattern using water-soluble organic over-coating material (WASOOM). According to the preferred embodiments of the present invention, a photoresist pattern that defines an opening therethrough is provided over a semiconductor substrate surface, which can include an insulating layer. Then, a layer of water-soluble organic over-coating material (WASOOM) is coated over the photoresist pattern including the opening thereof. Next, the resulting structure is flowed to shrink the size of the opening. After the resist reflow, WASOOM is removed simply by a hydrophilic-solution such as DI water. Eventually, the insulating layer is etched to form a contact hole therein, using the shrunken-opening photoresist pattern as an etching mask.

Thus, using the methods of the present invention, a photoresist pattern capable of forming a minimum feature size of 0.18 μm and below can be formed using a conventional optical lithography system.

Further, because WASOOM is water-soluble, WASOOM can be substantially completely removed from the photoresist pattern using a simple cleaning process, i.e., water rinse, after baking for resist reflow. During the reflowing step, the WASOOM plug limits reflow of resist into the opening. Thus, the process steps are simplified and the problems such as the difficulty in CD control and the environmental issues are avoided.

The foregoing and other objects, features and advantages of the invention will become more readily apparent from the following detailed description of a preferred embodiment of the invention that proceeds with reference to the accompanying drawings.

BRIEF DESCRIPTION OF THE DRAWINGS

FIG. 1 is a fragmentary schematic diagram depicting a cross-sectional view of a photoresist pattern with overhang profile formed without WASOOM.

FIG. 2 is a flow diagram illustrating process steps in accordance with one method of the prior art.

DETAILED DESCRIPTION

Figure 3:
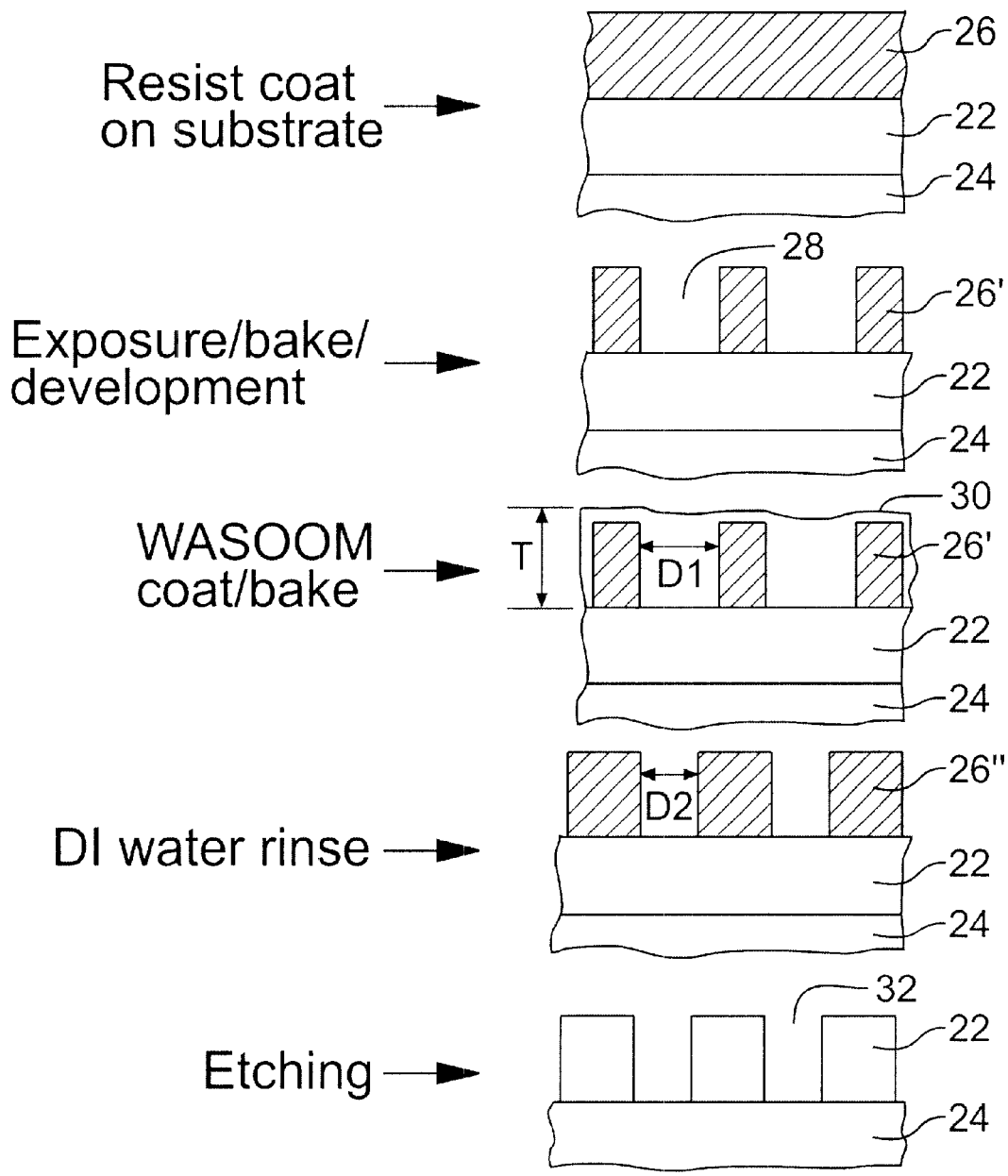
FIG. 3 is a flow diagram illustrating process steps in accordance with the present invention.

The disclosed preferred embodiment enables formation of a photoresist pattern for highly integrated ULSI circuits under the design rule of 0.18 μm and below with precise CD control, using conventional optical lithography equipment such as i-line lithography system. The present invention also simplifies the overall photoresist pattern formation process without causing environmental problems.

In the following description, numerous specific details are set forth to provide a thorough understanding of the present invention. However, one having ordinary skill in the art will recognize that the invention can be practiced without these specific details. In some instances, well-known structures and techniques have not been shown in detail to avoid unnecessarily obscuring the present invention.

Referring to FIG. 3, an insulating layer 22 is formed on the surface of semiconductor substrate 24. Next, to form a photoresist pattern defining a contact hole, a photoresist layer 26, for example, an i-line, Krf or ArF photoresist layer is formed on the insulating layer 22. Then, the photoresist layer 26 is selectively exposed through a photomask (not shown). The exposure of photoresist layer 26 can be performed by ultraviolet (UV) light, i-line, deep UV (D-UV), extreme-UV (E-UV), e-beam, or x-ray. Further, the photoresist layer 26 is developed to form a photoresist pattern 26' using a developing solution such as one containing 2.38 tetramethylammonium hydride (TMAH). As a result, a photoresist pattern 26' that defines an opening 28 therethrough is provided over the insulating layer 22.

Subsequently, a resist-reflow buffer layer 30 is coated over the photoresist pattern 26' including the opening 28 thereof to fill the opening. The resist-reflow buffer layer 30 is preferably coated to a thickness of approximately 2000 Å as indicated by dimension T in FIG. 3. In the present invention, the resist-reflow buffer layer 30 is formed of a water-soluble organic over-coating material (WASOOM). WASOOM used in the preferred embodiment is NFC-540 from JSR Microelectronics. Alternatively, WASOOM can be poly vinyl alcohol; carbazol; poly vinyl pyrrolidone; quaternary ammonium; sulphonium salt; $C_2$–$C_{10}$ alkane diols; guanidine; glycolic acid and glycolate salts; lactic acid and lactate salts; polyhydroxy alcohols; polyethylene glycol; sugar and starch; sugar and starch derivatives; panthenol; pyrrolidone carboxylic acid; hyaluronic acid; lactamide monoethanolamine; acetamide monoethanolamine; urea; ethanol amines of the general structure $(HOCH_2CH_2)_xNH_y$, where x=1–3; y=0–2, and x+y=3; a phosphate ester; alcohol; fatty acid including mono-, di-, tri-, and polyacids; fatty acid derivatives; or mixtures thereof However, this list is not intended to limit, but to illustrate a wide range of alternative materials. Any suitable water soluble organic over-coating material that does not substantially react with the photoresist pattern at baking temperature and thus does not substantially form an interfacial layer with the photoresist pattern can be used to implement the present invention. It is thought that thicker WASOOM can improve iso and dense bias because the thicker WASOOM can supply more space to the dense contact.

Following the coating of WASOOM, the resulting structure is resist-reflowed to shrink the size of the opening 28. The resist reflow is performed by heat treatment techniques, e.g., baking. This step of baking for contact hole shrinking is preferably performed at a temperature of approximately 50–200° C. More preferably, the baking for contact hole shrinking is performed at a temperature of approximately 150–170° C. Most preferably, the baking is performed at 165° C. because it is discovered that there is no iso-dense bias at that temperature. Also, the baking is preferably performed for less than approximately five minutes.

As a result of the baking, with the method of the present invention, 0.18 μm photoresist contact hole pattern has been achieved with precise CD control. It is believed that, because WASOOM acts as a resist-reflow buffer layer during baking or heating, the severe overhang illustrated in FIG. 1 does not occur in the present invention. In detail, the initial diameter of the opening in photoresist contact hole pattern, approximately 0.25 um~0.3 um (D1 of FIG. 3), can be reduced in size to approximately 0.15~0.2 um (D2 of FIG. 3) by resist reflow with WASOOM buffering the pattern and preventing it from being distorted out-of-shape or collapsing. To reduce the opening in the photoresist contact hole pattern using the resist flow technique while maintaining pattern fidelity, e.g., minimal top flare, and CD uniformity, approximately 50–80 nm CD shrink is preferred. For example, to form a 0.15 um contact hole, an approximately 0.2–0.23 um photoresist contact hole pattern is preferred.

Importantly, in the present invention, the WASOOM material survives baking, does not substantially react with the photoresist pattern and thus does not substantially form an interfacial layer with the photoresist pattern unlike the prior art methods. It is believed that such interfacial-layer-free interface between WASOOM and the photoresist material helps the photoresist pattern having an opening therein to flow evenly. In addition, the distribution of thermal stress is even from top to bottom of the photoresist pattern, thereby reducing overhang. As a result, the previously uncontrollable overhang profile shown in FIG. 1 can be avoided, thereby allowing precise CD control of the photoresist pattern.

After the resist reflow, WASOOM is removed. Particularly, WASOOM can be almost completely removed by rinsing the resulting structure with a hydrophilic developing solution. Thus, substantially no undesirable reactants are left on the side walls of the photoresist pattern 26". Preferably, the hydrophilic solution can be D1 water, TMAH-containing solution, alkyl alcohol, or mixtures thereof. Because WASOOM can be easily removed by a water-rinse step, the problems encountered in the cited references can be avoided. For example, many additional baking steps and photoresist development steps are not required in the present invention because only simple cleaning processes such as water rinse is needed for stripping WASOOM. Further, because there is no substantial reaction between the photoresist material and WASOOM, uncontrollable cross-linking leading to problems in CD control does not occur in practicing the present invention. In addition, because no undesirable reactants are left on the side walls of the photoresist pattern, CD control can be significantly improved in the present invention compared to the prior art. For these reasons, practical implementation of the above described resist reflow technologies is now very possible.

Finally, as shown in FIG. 3, the insulating layer 22 is etched to form a contact hole 32 therein using the shrunken-opening photoresist pattern 26" as an etching mask.

Alternatively, instead of using WASOOM to reduce a photoresist pattern to a contact hole in a semiconductor device, a SOG layer can be coated over the photoresist pattern including the opening thereof and, after resist reflow, the SOG layer can be removed by dipping the resulting structure with HF.

CONCLUSIONS

With the resist flow technique of the present invention using water-soluble organic over-coating material (WASOOM) as a resist-reflow buffer layer, a deep sub-micron, e.g., sub-0.18 µm contact hole for a semiconductor device can be formed with inexpensive conventional lithography techniques such as i-line, thereby extending the current lithography process for contact hole, for example, from approximately 0.25 µm region to approximately 0.15 µm region or below.

According to the present invention, thermal stress can be evenly distributed from the top to bottom of the photoresist pattern, thereby reducing overhang and improving CD control. Further, because WASOOM is water-soluble, WASOOM can be substantially completely removed from the photoresist pattern using a simple cleaning process, i.e., water rinse, after baking for resist reflow. Thus, process steps thus are simplified and the problems such as the difficulty in CD control and the environmental issues are avoided.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A method of forming a photoresist pattern defining a contact hole, comprising:
   providing a photoresist pattern that defines an opening therethrough over a semiconductor substrate surface;
   coating a layer of water-soluble organic over-coating material (WASOOM) over the photoresist pattern including the opening thereof;
   flowing the resulting structure to shrink the size of the opening at a temperature of approximately 150–170° C.; and
   removing the WASOOM.

2. The method of claim 1, wherein the WASOOM does not substantially react with the photoresist pattern and thus does not substantially form an interfacial layer with the photoresist pattern.

3. The method of claim 1, wherein said layer of WASOOM is coated to a thickness of approximately 2000 Å.

4. The method of claim 1, which further comprises forming an insulating layer on the semiconductor substrate surface and etching a contact opening through insulating layer using the shrunken open in photoresist pattern as a mask.

5. The method of claim 4, wherein the step of baking for contact hole shrinking is performed at a temperature of approximately 50–200° C.

6. The method of claim 1, wherein said flowing is performed by baking.

7. The method of claim 6, wherein said step of baking for contact hole shrinking is performed at a temperature of approximately 165° C.

8. The method of claim 6, wherein said step of baking is performed for less than approximately five minutes.

9. The method of claim 1, wherein said step of baking shrinks the photoresist to a sufficient extent that 0.18 µm minimum feature sizes are achieved.

10. The method of claim 1, wherein said providing a photoresist pattern comprises:
    coating an i-line, Krf or ArF photoresist layer on the insulating layer;
    selectively exposing the photoresist layer through a photomask; and
    developing the photoresist layer.

11. The method of claim 10, wherein said developing is performed by a developing solution containing 2.38 TMAH.

12. The method of claim 1, wherein the step of exposing photoresist is performed by ultraviolet (UV) light, i-line, deep UV (D-UV), extreme-UV (E-UV), e-beam, or x-ray.

13. The method of claim 1, wherein the WASOOM is selected from the group consisting of poly vinyl alcohol; carbazol; poly vinyl pyrrolidone; quaternary ammonium; sulphonium salt; $C_2$–$C_{10}$ alkane diols; guanidine; glycolic acid and glycolate salts; lactic acid and lactate salts; polyhydroxy alcohols; polyethylene glycol; sugar and starch; sugar and starch derivatives; panthenol; pyrrolidone carboxylic acid; hyaluronic acid; lactamide monoethanolamine; acetamide monoethanolamine; urea; and ethanol amines of the general structure $(HOCH_2CH_2)_x$, $NH_y$ where x=1–3; y=0–2, and x+y=3; a phosphate ester; alcohol; fatty acid including mono-, di-, tri-, and polyacids; fatty acid derivatives, and mixtures thereof.

14. The method of claim 1, wherein said removing the WASOOM comprises rinsing the resulting structure with a hydrophilic solution.

15. The method of claim 14, wherein said hydrophilic solution is selected from the group consisting of DI water, TMAH-containing solution, and alkyl alcohol.

16. A method of forming a contact hole, comprising:
    providing an insulating layer on a semiconductor substrate
    providing a photoresist pattern that defines an opening therethrough on the insulating layer;
    coating a water-soluble organic over-coating material (WASOOM) over the photoresist pattern including the opening therethrough;
    flowing the resulting structure to shrink the size of the opening;
    wherein the WASOOM does not substantially react with the photoresist pattern and thus does not substantially form an interfacial layer with the photoresist pattern;
    removing the WASOOM; and
    etching the insulating layer to form a contact hole using the shrunken-opening photoresist pattern as an etching mask.

17. A method of forming a contact hole, comprising:

providing an insulating layer on a semiconductor substrate;

providing a photoresist pattern that defines an opening therethrough on the insulating layer, the opening having a diameter of approximately 0.25 µm–0.3 µm;

coating a water-soluble organic over-coating material (WASOOM) over the photoresist pattern including the opening therethrough with a thickness of approximately 2000 Å;

flowing the resulting structure to shrink the size of the opening to approximately 0.15 µm–0.2 µm;

removing the WASOOM; and etching the insulating layer to form a contact hole using the shrunken-opening photoresist pattern as an etching mask, wherein the WASOOM does not substantially react with the photoresist pattern and thus does not substantially form an interfacial layer with the photoresist pattern.

18. A method of forming a contact hole in a semiconductor device, comprising:

forming a photoresist pattern that defines an opening therethrough over a semiconductor substrate;

coating a SOG layer over the photoresist pattern including the opening thereof;

heat-treating the resulting structure; and removing the SOG layer.

19. The method of claim 18, wherein said removing the SOG layer comprises dipping the resulting structure with HF.

20. A contact hole, formed by the process steps comprising:

providing an insulating layer on a semiconductor substrate;

providing a photoresist pattern that defines an opening therethrough on the insulating layer;

coating a water-soluble organic over-coating material (WASOOM) over the photoresist pattern including the opening therethrough;

flowing the resulting structure to shrink the size of the opening;

wherein the WASOOM does not substantially react with the photoresist pattern and thus does not substantially form an interfacial layer with the photoresist pattern;

removing the WASOOM; and etching the insulating layer to form a contact hole using the shrunken-opening photoresist pattern as an etching mask.

* * * * *